US012444622B2

(12) United States Patent
Hirase et al.

(10) Patent No.: US 12,444,622 B2
(45) Date of Patent: Oct. 14, 2025

(54) SUBSTRATE PROCESSING SYSTEM AND SUBSTRATE PROCESSING METHOD

(71) Applicant: Tokyo Electron Limited, Tokyo (JP)

(72) Inventors: Keita Hirase, Kumamoto (JP); Koji Tanaka, Kumamoto (JP); Yukiyoshi Saito, Kumamoto (JP); Keisuke Sasaki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 382 days.

(21) Appl. No.: 18/106,857

(22) Filed: Feb. 7, 2023

(65) Prior Publication Data

US 2023/0268202 A1 Aug. 24, 2023

(30) Foreign Application Priority Data

Feb. 21, 2022 (JP) .................................. 2022-024982
Oct. 14, 2022 (JP) .................................. 2022-165731

(51) Int. Cl.
*H01L 21/67* (2006.01)
*H01L 21/311* (2006.01)
*H01L 21/677* (2006.01)

(52) U.S. Cl.
CPC .. *H01L 21/67086* (2013.01); *H01L 21/31111* (2013.01); *H01L 21/67057* (2013.01);
(Continued)

(58) Field of Classification Search
CPC ......... H01L 21/67086; H01L 21/31111; H01L 21/67057; H01L 21/67161; H01L 21/67173; H01L 21/67742; H01L 21/67745; H01L 21/67748; H01L 21/67754; H01L 21/67757; H01L 21/67766; H01L 21/68707;
(Continued)

(56) References Cited

U.S. PATENT DOCUMENTS 12,322,631 B2 * 6/2025 Tsuchiya ........... H01L 21/67769
2021/0111038 A1 * 4/2021 Kanagawa ............ H01L 21/561
(Continued)

FOREIGN PATENT DOCUMENTS

JP 2021-064654 A 4/2021
JP 2025076103 A * 5/2025

*Primary Examiner* — Jeffrie R Lund
(74) *Attorney, Agent, or Firm* — Venjuris, P.C.

(57) ABSTRACT

A substrate processing system includes: a carry-in/out section in which a cassette accommodating a plurality of substrates is carried in/out; a batch processing section in which a wafer lot including the plurality of substrates is collectively processed; a single-wafer processing section in which the substrates of the wafer lot is processed one by one; and an interface section that delivers the substrates between the batch processing section and the single-wafer processing section. The batch processing section includes: a processing bath in which the wafer lot is immersed and processed; and a first transfer device that transfers the wafer lot to the processing bath. The interface section includes: an immersion bath disposed outside a movement range of the first transfer device and that immerses the wafer lot; and a second transfer device that holds and transfers the wafer lot between the first transfer device and the immersion bath.

12 Claims, 14 Drawing Sheets

(52) U.S. Cl.
CPC .. *H01L 21/67161* (2013.01); *H01L 21/67173* (2013.01); *H01L 21/67742* (2013.01); *H01L 21/67745* (2013.01); *H01L 21/67748* (2013.01); *H01L 21/67754* (2013.01); *H01L 21/67757* (2013.01); *H01L 21/67766* (2013.01)

(58) Field of Classification Search
CPC ......... H01L 21/67196; H01L 21/67034; H01L 21/67051; H01L 21/67781
See application file for complete search history.

(56) References Cited

U.S. PATENT DOCUMENTS

| | | | |
|---|---|---|---|
| 2021/0111054 A1* | 4/2021 | Kanagawa | H01L 21/67757 |
| 2023/0268202 A1* | 8/2023 | Hirase | H01L 21/68707 |
| | | | 438/747 |
| 2023/0268213 A1* | 8/2023 | Tsuchiya | H01L 21/67276 |
| | | | 414/217 |
| 2023/0282493 A1* | 9/2023 | Hirase | H01L 21/67718 |
| 2025/0038028 A1* | 1/2025 | Iwasaki | H01L 21/67745 |

\* cited by examiner

SUBSTRATE PROCESSING SYSTEM AND SUBSTRATE PROCESSING METHOD

CROSS-REFERENCE TO RELATED APPLICATIONS

This application is based on and claims priority from Japanese Patent Application Nos. 2022-024982 and 2022-165731, filed on Feb. 21, 2022 and Oct. 14, 2022, respectively, with the Japan Patent Office, the disclosures of which are incorporated herein in their entireties by reference.

TECHNICAL FIELD

The present disclosure relates to a substrate processing system and a substrate processing method.

BACKGROUND

A substrate processing system disclosed in Japanese Patent Laid-Open Publication No. 2021-064654 includes a batch processing section and a single-wafer processing section. The batch processing section holds a semiconductor wafer washed with water in the water. A plurality of semiconductor wafers is processed with a chemical liquid in a state of being placed on a single holding table. A transporting section picks up the semiconductor wafers one by one from a buffer bath and transports the semiconductor wafers to the single-wafer processing section. The single-wafer processing section dries the single semiconductor wafer transported by the transporting section while supporting the main surface of the single semiconductor wafer to be horizontal.

SUMMARY

A substrate processing system according to an aspect of the present disclosure includes: a carry-in/out section in which a cassette accommodating a plurality of substrates is carried in/out; a batch processing section in which a wafer lot including the plurality of substrates is collectively processed; a single-wafer processing section in which the plurality of substrates in the wafer lot are processed one by one; and an interface section that delivers the plurality of substrates between the batch processing section and the single-wafer processing section. The batch processing section includes a processing bath in which the wafer lot is immersed and processed and a first transfer device including a first transfer arm that transfers the wafer lot to the processing bath. The interface section includes: an immersion bath disposed outside a movement range of the first transfer device and configured to immerse the wafer lot; and a second transfer device including a second transfer arm that hold and transfers the wafer lot between the first transfer device and the immersion bath.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
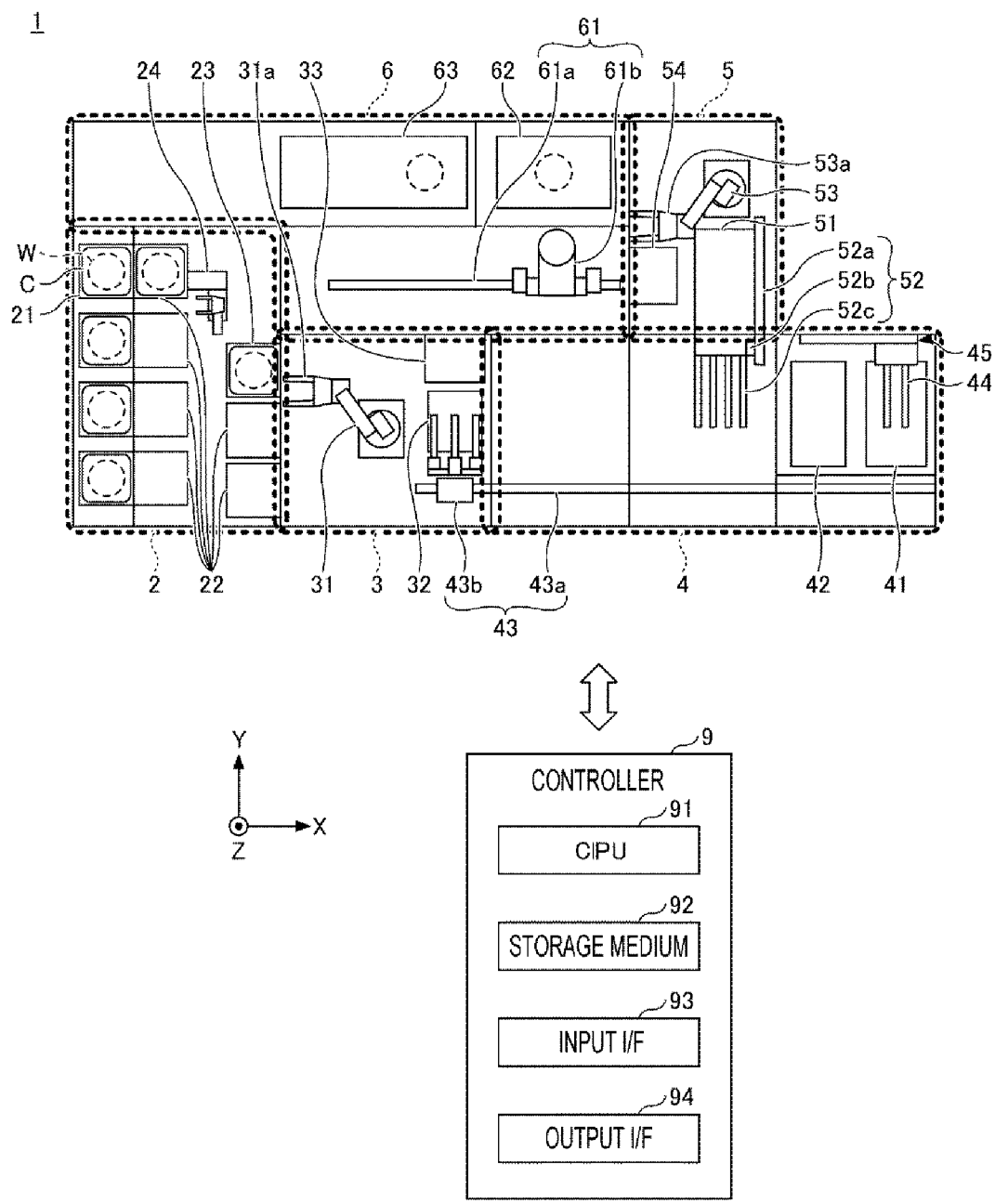
FIG. 1 is a schematic plan view illustrating a substrate processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In all of the accompanying drawings, the same or corresponding members or parts are denoted by the same or corresponding reference numerals, and redundant explanations are omitted.

Substrate Processing System

A substrate processing system according to an embodiment will be described with reference to FIG. 1. As illustrated in FIG. 1, a substrate processing system 1 includes a carry-in/out section 2, a first interface section 3, a batch processing section 4, a second interface section 5, a single-wafer processing section 6, and a controller 9.

The carry-in/out section 2 serves as both a carry-in section and a carry-out section. Therefore, the substrate processing system 1 may be miniaturized. The carry-in/out section 2 includes a load port 21, a stocker 22, a loader 23, and a cassette transfer device 24.

The load port 21 is disposed on a negative side of the carry-in/out section 2 in the X-axis direction. A plurality of (e.g., four) load ports 21 is disposed along the Y-axis direction. However, the number of the load ports 21 is not particularly limited. A cassette C is placed on the load port 21. The cassette C accommodates a plurality of (e.g., 25) substrates W, and is carried into/out from the load port 21. In the inside of the cassette C, the substrates W are held horizontally, and held in the vertical direction at a second pitch P2 that is N times a first pitch P1 (P2=N×P1). N is a natural number of 2 or more, and is 2 in this embodiment, but may be 3 or more.

A plurality of (e.g., four) stockers 22 is disposed in the center of the carry-in/out section 2 in the X-axis direction along the Y-axis direction. A plurality of (e.g., two) stockers 22 is disposed adjacent to the first interface section 3 along the Y-axis direction on a positive side of the carry-in/out section 2 in the X-axis direction. The stocker 22 may be disposed in multiple tiers in the vertical direction. The stocker 22 temporarily stores a cassette C that accommodates the substrates W before a cleaning processing is accommodated or an empty cassette C after the substrates W are taken out. The number of the stockers 22 is not particularly limited.

The loader 23 is adjacent to the first interface section 3 and is disposed on the positive side of the carry-in/out section 2 in the X-axis direction. The cassette C is placed on the loader 23. The loader 23 is provided with a lid opening/closing mechanism (not illustrated) that opens/closes a lid of the cassette C. A plurality of loaders 23 may be provided. The loader 23 may be disposed in multiple tiers in the vertical direction.

The cassette transfer device 24 is, for example, an articulated transfer robot. The cassette transfer device 24 transfers the cassette C among the load port 21, the stocker 22, and the loader 23.

The first interface section 3 is disposed on the positive side of the carry-in/out section 2 in the X-axis direction. The first interface section 3 transfers the substrate W among the carry-in/out section 2, the batch processing section 4, and the single-wafer processing section 6. The first interface section 3 includes a substrate feeding device 31, a lot forming unit 32, and a first delivery table 33.

The substrate feeding device 31 transfers the substrate W among the cassette C placed on the loader 23, the lot forming unit 32, and the first delivery table 33. The substrate feeding device 31 is constituted by a multi-axis (e.g., six-axis) arm robot, and includes a substrate holding arm 31a at a tip thereof. The substrate holding arm 31a includes a plurality of holding claws (not illustrated) capable of holding a plurality of (e.g., 25) substrates W. The substrate holding arm 31a may take any position and posture in the three-dimensional space while holding the substrate W by the holding claws.

The lot forming unit 32 is disposed on the positive side of the first interface section 3 in the X-axis direction. The lot forming unit 32 holds a plurality of substrates W at the first pitch P1, and forms a lot L.

The first delivery table 33 is adjacent to the single-wafer processing section 6 and is disposed on the positive side of the first interface section 3 in the X-axis direction. The first delivery table 33 receives the substrate W from a fourth transfer device 61 and temporarily stores the substrate W until it is delivered to the carry-in/out section 2.

The batch processing section 4 is disposed on the positive side of the first interface section 3 in the X-axis direction. That is, the carry-in/out section 2, the first interface section 3, and the batch processing section 4 are disposed in this order from the negative side in the X-axis direction to the positive side in the X-axis direction. The batch processing section 4 collectively processes the lot L including a plurality of (e.g., 50 or 100) substrates W at the first pitch P1. One lot L is constituted by, for example, substrates of M cassettes C. M is a natural number of 2 or more. M may be a natural number that is the same as N, or a natural number different from N. The batch processing section 4 includes a chemical liquid bath 41, a rinse liquid bath 42, a first transfer device 43, a processing mechanism 44, and a driving device 45.

The chemical liquid bath 41 and the rinse liquid bath 42 are disposed along the X-axis direction. For example, the chemical liquid bath 41 and the rinse liquid bath 42 are arranged in this order from the positive side in the X-axis direction toward the negative side in the X-axis direction. The chemical liquid bath 41 and the rinse liquid bath 42 are also collectively referred to as a processing bath. The number of the chemical liquid baths 41 and the number of the rinse liquid baths 42 are not limited to those in FIG. 1. For example, one set of the chemical liquid bath 41 and the rinse liquid bath 42 is in FIG. 1, but a plurality of sets may be provided.

The chemical liquid bath 41 stores a chemical liquid in which the lot L is immersed. The chemical liquid is, for example, a phosphoric acid aqueous solution $H_3PO_4$. The phosphoric acid aqueous solution selectively etches and removes a silicon nitride film between a silicon oxide film and the silicon nitride film. The chemical liquid is not limited to the phosphoric acid aqueous solution. For example, a dilute hydrofluoric acid (DHF), a mixed liquid of hydrofluoric acid and ammonium fluoride (BHF), a dilute sulfuric acid, a mixed liquid of sulfuric acid, hydrogen peroxide, and water (SPM), a mixed liquid of ammonia, hydrogen peroxide, and water (SC1), a mixed liquid of hydrochloric acid, hydrogen peroxide, and water (SC2), a mixed liquid of tetramethylammonium hydroxide and water (TMAH), or a plating liquid, The chemical liquid may be for a peeling processing or a plating processing. The number of the chemical liquids is not particularly limited, and may be plural.

The rinse liquid bath 42 stores a first rinse liquid in which the lot L is immersed. The first rinse liquid is pure water (e.g., deionized water (DIW)) that removes the chemical liquid from the substrate W.

The first transfer device 43 includes a guide rail 43a and a first transfer arm 43b. The guide rail 43a is disposed on the negative side of the processing bath in the Y-axis direction. The guide rail 43a extends from the first interface section 3 to the batch processing section 4 along the horizontal direction (X-axis direction). The first transfer arm 43b moves in the horizontal direction (X-axis direction) along the guide rail 43a. The first transfer arm 43b may move in the vertical direction, or may rotate around a vertical axis. The first transfer arm 43b collectively transfers the lot L between the first interface section 3 and the batch processing section 4.

The processing mechanism 44 receives and holds the lot L from the first transfer arm 43b. The processing mechanism 44 holds a plurality of substrates W in the Y-axis direction at the first pitch P1, and vertically holds each of the plurality of substrates W.

The driving device 45 moves the processing mechanism 44 in the X-axis direction and in the Z-axis direction. The processing mechanism 44 immerses the lot L in the chemical liquid stored in the chemical liquid bath 41, and immerses the lot L in the first rinse liquid stored in the rinse liquid bath 42, and then, delivers the lot L to the first transfer device 43.

The number of units of the processing mechanism 44 and the driving device 45 is one in this embodiment, but may be two or more. In the latter case, one unit immerses the lot L in the chemical liquid stored in the chemical liquid bath 41, and another unit immerses the lot L in the first rinse liquid stored in the rinse liquid bath 42. In this case, the driving device 45 may move the processing mechanism 44 in the Z-axis direction, and may not move the processing mechanism 44 in the X-axis direction.

The second interface section 5 is disposed on the positive side of the batch processing section 4 in the Y-axis direction. The second interface section 5 transfers the substrate W between the batch processing section 4 and the single-wafer processing section 6. The second interface section 5 includes an immersion bath 51, a second transfer device 52, a third transfer device 53, and a second delivery table 54.

The immersion bath 51 is disposed outside the movement range of the first transfer arm 43b. For example, the immersion bath 51 is disposed at a position deviated from the processing bath to the positive side in the Y-axis direction. The immersion bath 51 stores a second rinse liquid in which the lot L is immersed. The second rinse liquid is, for example, deionized water (DIW). The substrate W is held in the second rinse liquid until the substrate W is lifted from the second rinse liquid by the third transfer device 53. Since the substrate W exists below the liquid surface of the second rinse liquid, the surface tension of the second rinse liquid does not act on the substrate W, and thus, the uneven pattern of the substrate W may be prevented from collapsing. The immersion bath 51 may be configured to be movable in the X-axis direction. In this case, when the lot L is immersed in the immersion bath 51, the positional deviation in the X-axis direction between the immersion bath 51 and the lot L may be corrected. An X-axis driving device (not illustrated) that moves the immersion bath 51 in the X-axis direction is attached, for example, to the lower surface of the immersion bath 51.

The second transfer device 52 includes a Y-axis driving device 52a, a Z-axis driving device 52b, and a second transfer arm 52c.

The Y-axis driving device 52a is disposed on the positive side of the second interface section 5 in the X-axis direction. The Y-axis driving device 52a extends from the second interface section 5 to the batch processing section 4 along the horizontal direction (Y-axis direction). The Y-axis driving device 52a moves the Z-axis driving device 52b and the second transfer arm 52c in the Y-axis direction. The Y-axis driving device 52a may include a ball screw. The Y-axis driving device 52a is an example of a horizontal driving device.

The Z-axis driving device 52b is movably attached to the Y-axis driving device 52a. The Z-axis driving device 52b moves the second transfer arm 52c in the Z-axis direction. The Z-axis driving device 52b may include a ball screw. The Z-axis driving device 52b is an example of a vertical driving device.

The second transfer arm 52c is movably attached to the Z-axis driving device 52b. The second transfer arm 52c receives and holds the lot L from the first transfer arm 43b. The second transfer arm 52c holds a plurality of substrates W in the Y-axis direction at the first pitch P1, and vertically holds each of the plurality of substrates W. The second transfer arm 52c is moved in the Y-axis direction and in the Z-axis direction by the Y-axis driving device 52a and the Z-axis driving device 52b. The second transfer arm 52c is configured so as to be movable to a plurality of positions including a delivery position A1, an immersion position A2, and a standby position A3 illustrated in FIG. 7. The second transfer arm 52c may be configured to be movable in the X-axis direction. In this case, when the lot L is immersed in the immersion bath 51, the positional deviation in the X-axis direction between the immersion bath 51 and the lot L may be corrected. An X-axis driving device (not illustrated) that moves the second transfer arm 52c in the X-axis direction is movably attached, for example, to the Z-axis driving device 52b. In this case, the second transfer arm 52c is movably attached to the X-axis driving device.

The delivery position A1 is a position where the delivery of the lot L between the first transfer arm 43b and the second transfer arm 52c is performed. The delivery position A1 is a position on the negative side in the Y-axis direction and on the positive side in the Z-axis direction.

The immersion position A2 is a position where the lot L is immersed in the immersion bath 51. The immersion position A2 is a position on the positive side in the Y-axis direction and on the negative side in the Z-axis direction from the delivery position A1.

The standby position A3 is a position where the second transfer arm 52c stands by when the delivery of the lot L and the immersion of the lot L into the immersion bath 51 are not performed. The standby position A3 is a position immediately below (negative side in the Z-axis direction) the delivery position A1, and a position that does not hinder the movement of the first transfer arm 43b. In this case, since the second transfer arm 52c may be moved to the delivery position A1 only by moving upward (positive side in the Z-axis direction), the throughput is improved. The standby position A3 may be the same position as the immersion position A2. In this case, it is possible to prevent particles that may be generated as the first transfer device 43 is operated from adhering to the second transfer arm 52c. The standby position A3 may be a position immediately above (positive side in the Z-axis direction) the immersion position A2. As described above, it is possible to prevent the first transfer arm 43b and the second transfer arm 52c from being in contact with each other by setting the standby position A3 to a position different from that of the delivery position A1.

The second transfer device 52 as described above moves the second transfer arm 52c to the immersion position A2 or the standby position A3 while the first transfer device 43 is being operated. As a result, it is possible to prevent the first transfer arm 43b and the second transfer arm 52c from being in contact with each other.

The third transfer device 53 is constituted by a multi-axis (e.g., six-axis) arm robot, and includes a third transfer arm 53a at a tip thereof. The third transfer arm 53a includes a holding claw (not illustrated) capable of holding one substrate W. The third transfer arm 53a may take any position and posture in the three-dimensional space while holding the substrate W by the holding claw. The third transfer device 53 transfers the substrate W between the second transfer arm 52c at the immersion position A2 and the second delivery table 54. At this time, since the immersion bath 51 is disposed outside the movement range of the first transfer arm 43b, the first transfer arm 43b and the third transfer arm 53a do not interfere with each other. As a result, it is possible to independently operate one of the first transfer device 43 and the third transfer device 53 regardless of the operation state of the other. Therefore, since the first transfer device 43 and the third transfer device 53 may be operated at an arbitrary timing, it is possible to shorten the time required for transferring the substrate W. As a result, the productivity of the substrate processing system 1 is improved.

The second delivery table 54 is adjacent to the single-wafer processing section 6 and is disposed on the negative side of the second interface section 5 in the X-axis direction. The second delivery table 54 receives the substrate W from the third transfer device 53 and temporarily stores the substrate W until it is delivered to the single-wafer processing section 6. That is, the substrate W taken out from the immersion bath 51 is placed on the second delivery table 54.

The substrate W placed on the second delivery table 54 may be, for example, in a state where the surface is wet with the second rinse liquid. In this case, the surface tension of the second rinse liquid does not act on the substrate W, and thus, the uneven pattern of the substrate W may be suppressed from collapsing. A plurality of (e.g., two) substrates W is placed on the second delivery table 54.

The single-wafer processing section 6 is disposed on the negative side of the second interface section 5 in the X-axis direction and on the positive side of the carry-in/out section 2, the first interface section 3, and the batch processing section 4 in the Y-axis direction. The single-wafer processing section 6 processes the substrate W one by one. The single-wafer processing section 6 includes a fourth transfer device 61, a liquid processing device 62, and a drying device 63.

The fourth transfer device 61 includes a guide rail 61a and a fourth transfer arm 61b. The guide rail 61a is disposed on the negative side of the single-wafer processing section 6 in the Y-axis direction. The guide rail 61a extends in the single-wafer processing section 6 along the horizontal direction (X-axis direction). The fourth transfer arm 61b moves in the horizontal direction (X-axis direction) and the vertical direction along the guide rail 61a, and rotates around the vertical axis. The fourth transfer arm 61b transfers the substrate W among the second delivery table 54, the liquid processing device 62, the drying device 63, and the first delivery table 33. The number of the fourth transfer arms 61b may be one, or two or more. In the latter case, the fourth transfer device 61 collectively transfers a plurality of (e.g., 5) substrates W.

The liquid processing device 62 is disposed on the positive side in the X-axis direction and on the positive side in the Y-axis direction of the single-wafer processing section 6. The liquid processing device 62 is a single-wafer type, and processes the substrate W with the processing liquid one by one. The liquid processing device 62 is disposed in multiple tiers (e.g., three tiers) in the vertical direction (Z-axis direction). As a result, a plurality of substrates W may be processed with the processing liquid at the same time. A plurality of processing liquids may be used. For example, the processing liquids may include pure water such as DIW, and a drying liquid having a lower surface tension than the pure water. The drying liquid may be, for example, alcohol such as isopropyl alcohol (IPA).

The drying device 63 is disposed adjacent to the negative side of the liquid processing device 62 in the X-axis direction. In this case, the end portion surface of the single-wafer processing section 6 on the positive side in the Y-axis direction may be disposed to be flush with, or substantially flush with the end surface of the second interface section 5 on the positive side in the Y-axis direction. Therefore, since a dead space hardly occurs, the footprint of the substrate processing system 1 may be reduced.

With regard to this, when the drying device 63 is disposed adjacent to the positive side of the liquid processing device 62 in the Y-axis direction, the end portion surface of the single-wafer processing section 6 on the positive side in the Y-axis direction protrudes from the end portion surface of the second interface section 5 on the positive side in the Y-axis direction, which may occur a dead space. The drying device 63 is a single-wafer type, and dries the substrate W with a supercritical fluid one by one. The drying device 63 is disposed in multiple tiers (e.g., three tiers) in the vertical direction. As a result, a plurality of substrates W may be dried at the same time.

Both the liquid processing device 62 and the drying device 63 may not be a single-wafer type, or the liquid processing device 62 may be a single-wafer type and the drying device 63 may be a batch type. The drying device 63 may collectively dry a plurality of substrates W with the supercritical fluid. The number of the substrates W that are collectively processed in the drying device 63 may be more than the number of the substrates W that are collectively processed in the liquid processing device 62, or may be less. Devices other than the liquid processing device 62 and the drying device 63 may be disposed in the single-wafer processing section 6.

The controller 9 is, for example, a computer, and includes a central processing unit (CPU) 91 and a storage medium 92 such as a memory. The storage medium 92 stores a program that controls various processings performed in the substrate processing system 1. The controller 9 controls the operation of the substrate processing system 1 by causing the CPU 91 to execute the programs stored in the storage medium 92. The controller 9 includes an input interface 93 and an output interface 94. The controller 9 receives a signal from the outside through the input interface 93, and sends a signal to the outside from the output interface 94.

The programs are stored in, for example, a computer-readable storage medium, and installed from the storage medium to the storage medium 92 of the controller 9. For example, the computer-readable recording medium may be a hard disk (HD), a flexible disk (FD), a compact disk (CD), a magnet optical disk (MO), or a memory card. The programs may be downloaded from a server through the Internet, and installed in the storage medium 92 of the controller 9.

In the substrate processing system, the substrate W is transferred from the carry-in/out section 2 to the first interface section 3, the batch processing section 4, the second interface section 5, and the single-wafer processing section 6, and is returned to the carry-in/out section 2.

Operation of Substrate Processing System

Figure 2:
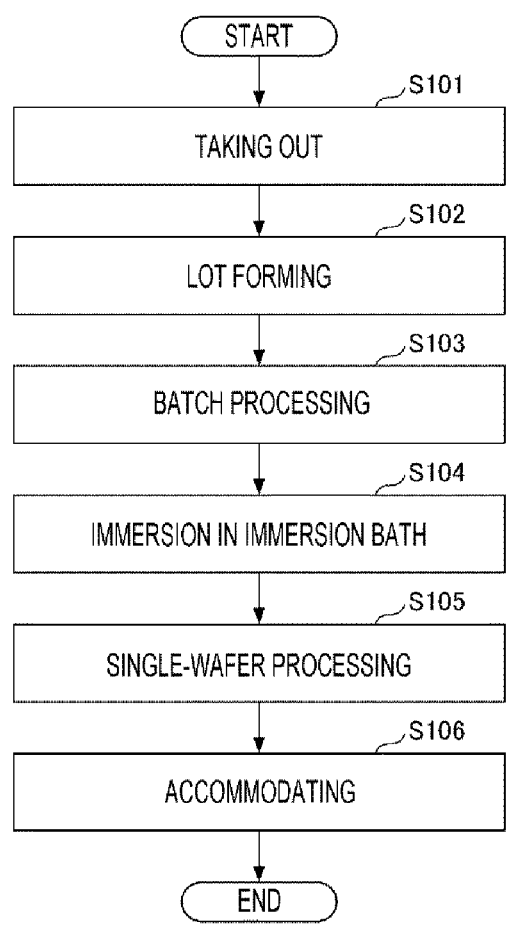
FIG. 2 is a flowchart illustrating a substrate processing method according to an embodiment.

An operation of the substrate processing system 1 according to the embodiment, that is, a substrate processing method will be described with reference to FIG. 2. The processing illustrated in FIG. 2 is performed under the control by the controller 9.

First, the cassette C is carried into the carry-in/out section 2 in a state of accommodating a plurality of substrates W, and is placed on the load port 21. In the inside of the cassette C, the substrates W are held horizontally, and held in the vertical direction at the second pitch P2 (P2=N×P1). N is a natural number of 2 or more, and is 2 in this embodiment, but may be 3 or more.

Next, the cassette transfer device 24 transfers the cassette C from the load port 21 to the loader 23. The lid of the cassette C transferred to the loader 23 is opened by the lid opening/closing mechanism.

Next, the substrate feeding device 31 receives the substrate W accommodated in the cassette C (S101 in FIG. 2), and transfers the substrate W to the lot forming unit 32.

Next, the lot forming unit 32 holds a plurality of substrates W at the first pitch P1 (P1=P2/N), and forms the lot L (S102 in FIG. 2). One lot L is constituted by, for example, substrates of M cassettes C. Since the pitch of the substrate W is narrowed from the second pitch P2 to the first pitch P1, the number of the substrates W that are collectively processed may be increased.

Next, the first transfer device 43 receives the lot L from the lot forming unit 32, and transfers the lot L to the processing mechanism 44.

Next, the processing mechanism 44 is lowered from an upper side of the chemical liquid bath 41 to immerse the lot L in the chemical liquid, thereby being processed with the chemical liquid (S103 in FIG. 2). Thereafter, the processing mechanism 44 is raised in order to lift up the lot L from the chemical liquid, and then, is moved in the horizontal direction (negative side in the X-axis direction) toward an upper side of the rinse chemical bath 42.

Next, the processing mechanism 44 is lowered from the upper side of the rinse liquid bath 42 to immerse the lot L in the rinse liquid, thereby being processed with the rinse liquid (S103 in FIG. 2). Thereafter, the processing mechanism 44 is raised to lift up the lot L from the first rinse liquid. Subsequently, the first transfer device 43 receives the lot L from the processing mechanism 44, and transfers the lot L to the second transfer device 52.

Next, the second transfer arm 52c of the second transfer device 52 is moved in the horizontal direction (positive side in the Y-axis direction), and is lowered from an upper side of the immersion bath 51 to immerse the lot L in the second rinse liquid (S104 in FIG. 2). A plurality of substrates W in the lot L is held in the second rinse liquid until the substrates W are lifted from the second rinse liquid by the third transfer device 53. Since the substrates W exist below the liquid surface of the second rinse liquid, the surface tension of the second rinse liquid does not act on the substrates W, and thus, the uneven pattern of the substrates W may be prevented from collapsing.

Next, the third transfer device 53 transfers the substrate W in the lot L held by the second transfer arm 52c in the second rinse liquid to the second delivery table 54. The third transfer device 53 transfers the substrate W to the second delivery table 54 one by one.

Next, the fourth transfer device 61 receives the substrate W from the second delivery table 54, and transfers the substrate W to the liquid processing device 62.

Next, the liquid processing device 62 processes the substrate W with a liquid one by one (S105 in FIG. 2). A plurality of liquids may be used, for example, pure water such as DIW, and a drying liquid having a lower surface tension than pure water. The drying liquid may be, for example, alcohol such as IPA. The liquid processing device 62 supplies pure water and the drying liquid to the upper surface of the substrate W in this order so as to form a liquid film of the drying liquid.

Next, the fourth transfer device 61 receives the substrate W from the liquid processing device 62, and horizontally holds the substrate W such that the liquid film of the drying liquid faces upward. The fourth transfer device 61 transfers the substrate W from the liquid processing device 62 to the drying device 63.

Next, the drying device 63 dries the substrate W with the supercritical fluid one by one (S105 in FIG. 2). The drying liquid may be replaced with the supercritical fluid, and it is possible to suppress the uneven pattern of the substrate W due to the surface tension of the drying liquid from collapsing. Since the supercritical fluid requires a pressure vessel, in order to miniaturize the pressure vessel, the single-wafer processing is performed instead of the batch processing.

The drying device 63 is a single-wafer type in this embodiment, but may be a batch type as described above. The batch type drying device 63 collectively dries a plurality of substrates W on which the liquid film is formed, with the supercritical fluid. While the single-wafer type drying device 63 includes one transfer arm that holds the substrate W, the batch type drying device 63 includes a plurality of transfer arms.

Next, the fourth transfer device 61 receives the substrate W from the drying device 63, and transfers the substrate W to the first delivery table 33.

Next, the substrate feeding device 31 receives the substrate W from the first delivery table 33, and accommodates the substrate W in the cassette C (S106 in FIG. 2). The cassette C is carried out from the carry-in/out section 2 in a state of accommodating a plurality of substrates W.

Operation of Second Interface Section

An operation of the second interface section 5 will be described with reference to FIGS. 3 to 7. The operation of the second interface section 5 is controlled by the controller 9.

Figure 3:
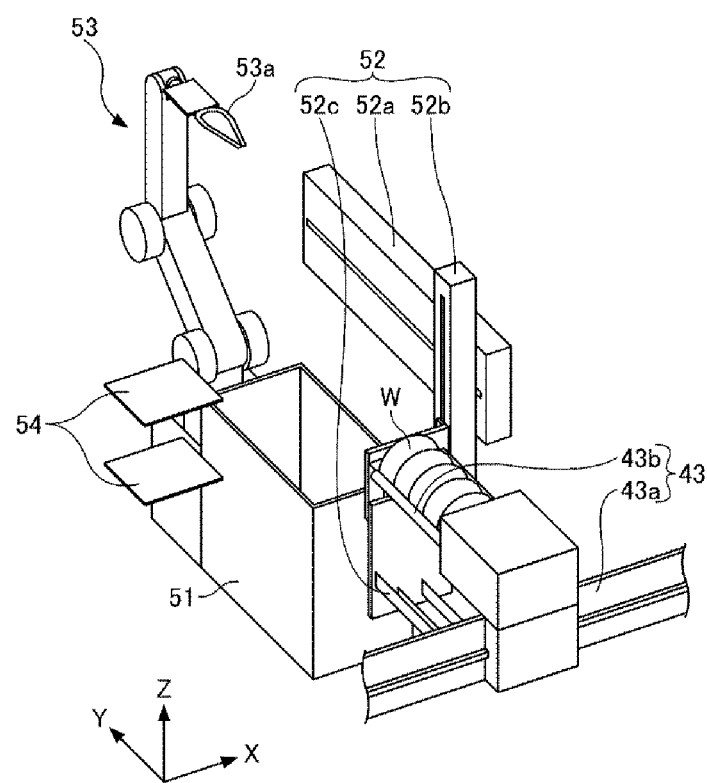
FIG. 3 is a schematic perspective view illustrating an operation of a second interface section.

First, as described in FIG. 3, the first transfer arm 43b receives the lot L from the processing mechanism 44, and is moved to the position where the lot L is delivered to the second transfer arm 52c in the negative side in the X-axis direction along the guide rail 43a. At this time, the second transfer arm 52c stands by at the standby position A3. As a result, the first transfer arm 43b may be moved to the position where the lot L is delivered to the second transfer arm 52c without being brought in contact with the second transfer arm 52c.

Figure 4:
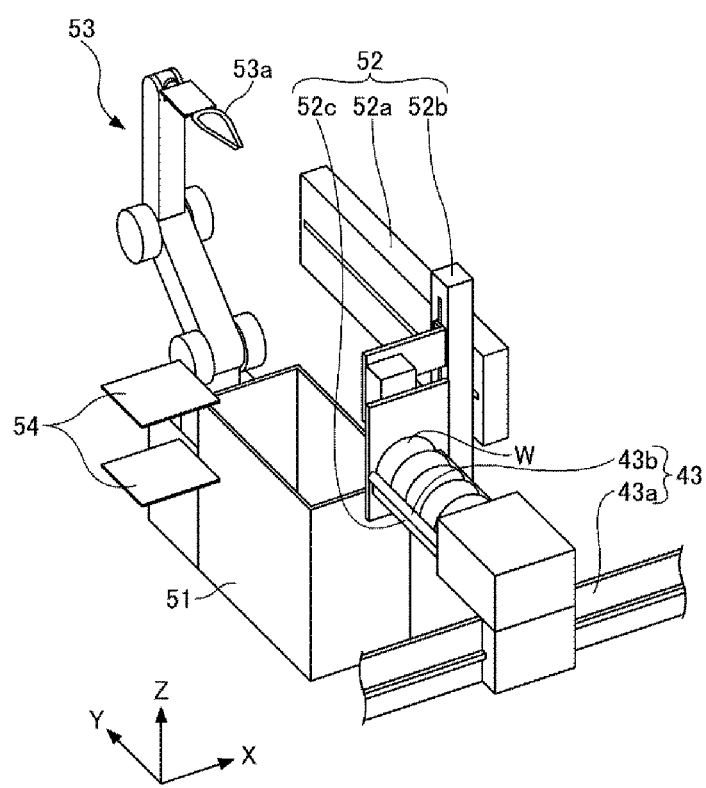
FIG. 4 is a schematic perspective view illustrating the operation of the second interface section.

Next, as illustrated in FIG. 4, the second transfer arm 52c is moved from the standby position A3 to the delivery position A1, and receives and holds the lot L from the first transfer arm 43b. That is, as illustrated by an arrow F1 in FIG. 1, the second transfer arm 52c is moved upward (positive side in the Z-axis direction) from the standby position A3, and receives the lot L from the first transfer arm 43b.

Figure 5:
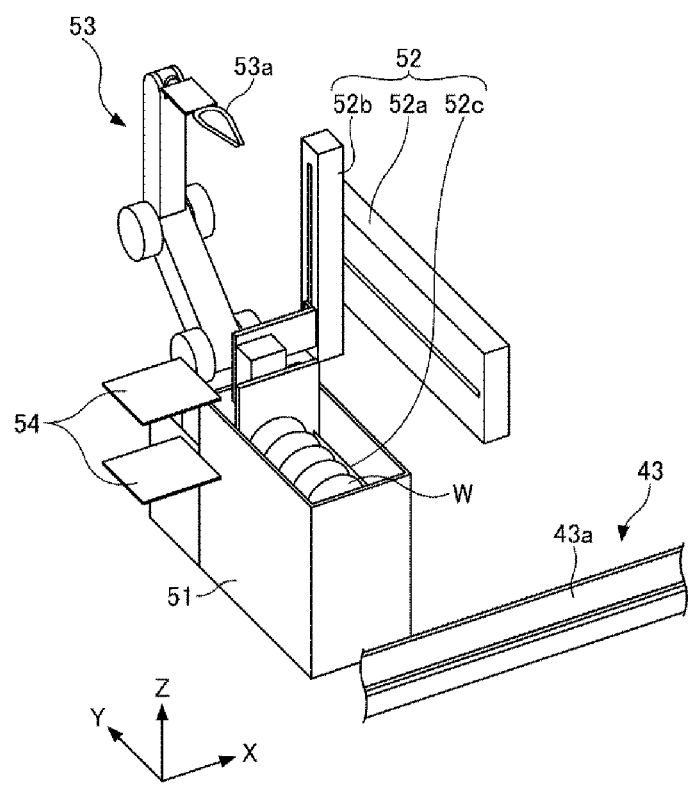
FIG. 5 is a schematic perspective view illustrating the operation of the second interface section.

Next, as illustrated in FIG. 5, the second transfer arm 52c is moved from the delivery position A1 to the immersion position A2 to immerse the lot L in the immersion bath 51. That is, as illustrated by an arrow F2 in FIG. 7, the second transfer arm 52c is moved from the delivery position A1 to the upper side of the immersion bath 51 in the horizontal direction (positive side in the Y-axis direction). Subsequently, as illustrated by an arrow F3 in FIG. 7, the second transfer arm 52c is lowered from the upper side of the immersion bath 51 to the immersion position A2 to immerse the lot L in the second rinse liquid stored in the immersion bath 51.

Figure 6:
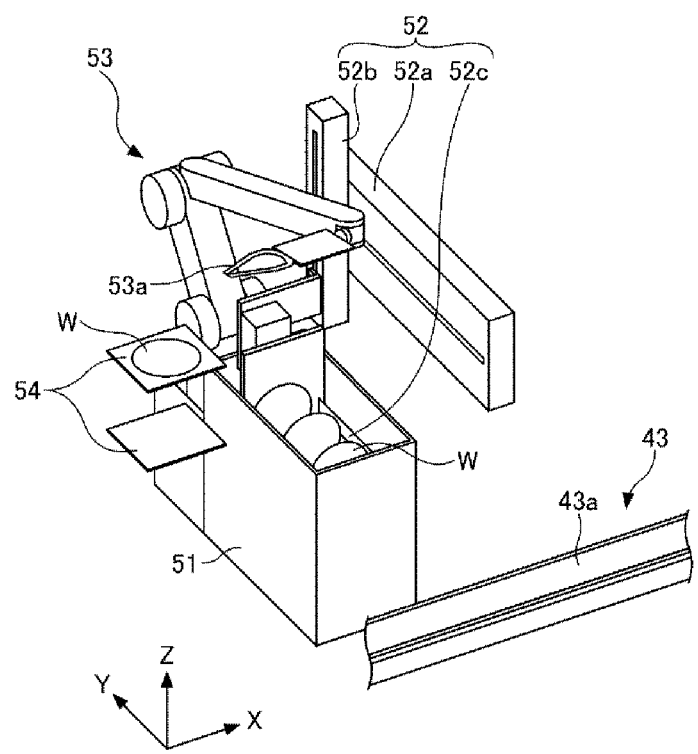
FIG. 6 is a schematic perspective view illustrating the operation of the second interface section.

Next, as illustrated in FIG. 6, the third transfer device 53 transfers the substrate W in the lot L held by the second transfer arm 52c in the second rinse liquid to the second delivery table 54. The third transfer device 53 transfers the substrate W to the second delivery table 54 one by one. At this time, since the immersion bath 51 is disposed outside the movement range of the first transfer arm 43b, the first transfer arm 43b and the third transfer arm 53a do not interfere with each other. As a result, it is possible to independently operate one of the first transfer device 43 and the third transfer device 53 regardless of the operation state of the other. That is, exclusive control becomes unnecessary. Therefore, since the first transfer device 43 and the third transfer device 53 may be operated at an arbitrary timing, it is possible to shorten the time required for transferring the substrate W. As a result, the productivity of the substrate processing system 1 is improved.

Figure 7:
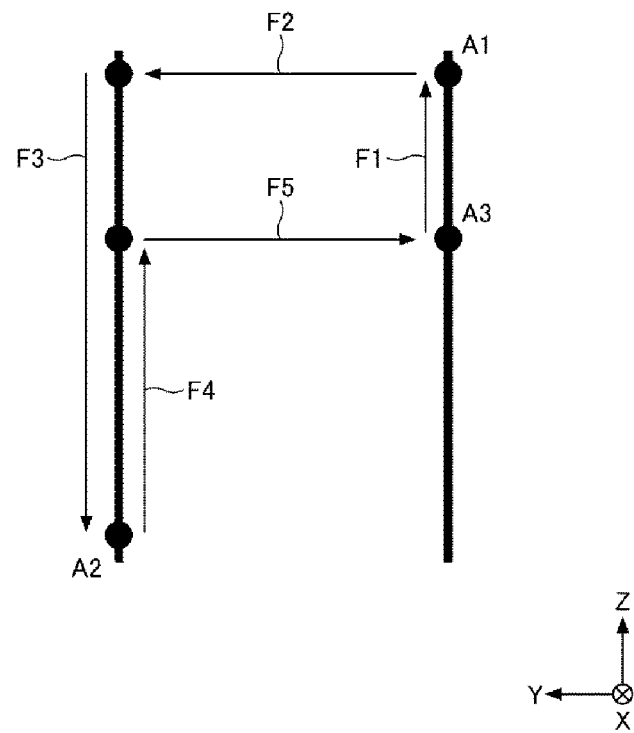
FIG. 7 is a view illustrating an operation of a second transfer device.

Next, when all the substrates W in the lot L held by the second transfer arm 52c are taken out, the second transfer arm 52c is moved to the standby position A3, and stands by until the next lot L is transferred by the first transfer arm 43b. As illustrated by an arrow F4 in FIG. 7, the second transfer arm 52c is moved upward (upward in the Z-axis direction) from the immersion position A2 to the height the same as the standby position A3, and then, as illustrated in an arrow F5 in FIG. 7, is moved to the standby position A3 in the horizontal direction (negative side in the Y-axis direction). In this case, the second transfer arm 52c is moved to the standby position A3 via the position lower than the delivery position A1, and thus, the contact with the first transfer arm 43b may be prevented. The path along which the second transfer arm 52c is moved from the immersion position A2 to the standby position A3 may be the same as the path along which the second transfer arm 52c is moved from the standby position A3 to the immersion position A2.

According to the second interface section 5 described above, the substrate W transferred from the batch processing section 4 to the single-wafer processing section 6 is held in the second rinse liquid until the substrate is lifted from the second rinse liquid by the third transfer device 53. Since the substrate W exists below the liquid surface of the second rinse liquid, the surface tension of the second rinse liquid does not act on the substrate W, and thus, the uneven pattern of the substrate W may be prevented from collapsing.

Modification

A second interface section 5A according to Modification 1 will be described with reference to FIG. 8. The second interface section 5A is different from the second interface section 5 in that the third transfer device 53 is attached above the upper surface of the immersion bath 51. Other configurations of the second interface section 5A may be the same as those of the second interface section 5.

Figure 8:
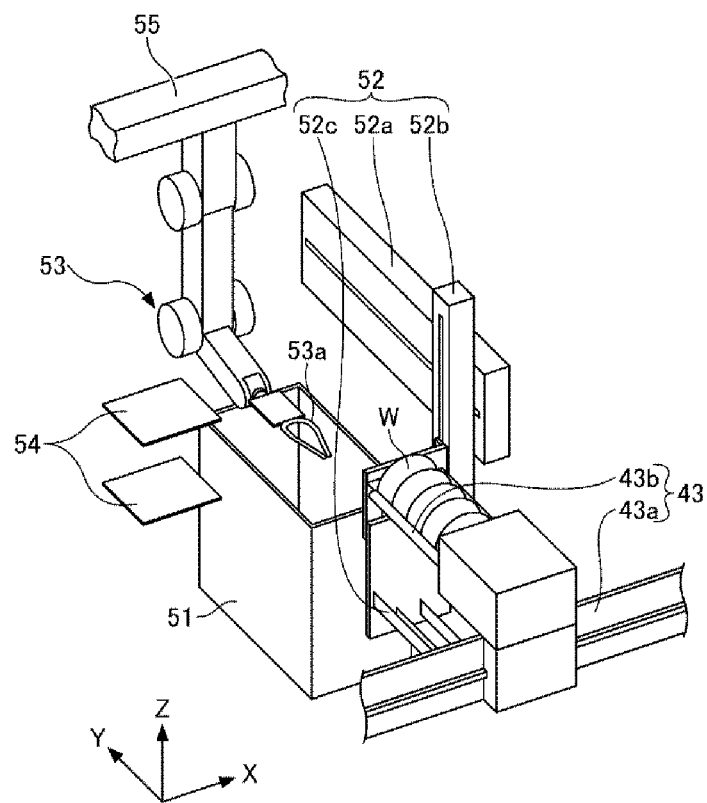
FIG. 8 is a schematic perspective view illustrating a second interface section of Modification 1.

As illustrated in FIG. 8, the third transfer device 53 is attached to, for example, a frame member 55 extending in the X-axis direction above the immersion bath 51 among the frame members defining the second interface section 5A. The third transfer device 53 may be supported to be movable along the X-axis direction by the frame member 55. The third transfer device 53 may be attached to a frame member (not illustrated) extending in the Y-axis direction above the immersion bath 51 among the frame members defining the second interface section 5A.

A second interface section 5B according to Modification 2 will be described with reference to FIG. 9. The second interface section 5B is different from the second interface section 5 in that the second transfer arm 52c is supported to be movable along the Y-axis direction by the Y-axis driving device 52a, and the Y-axis driving device 52a is supported to be movable along the Z-axis direction by the Z-axis driving device 52b. Other configurations of the second interface section 5B may be the same as those of the second interface section 5.

Figure 9:
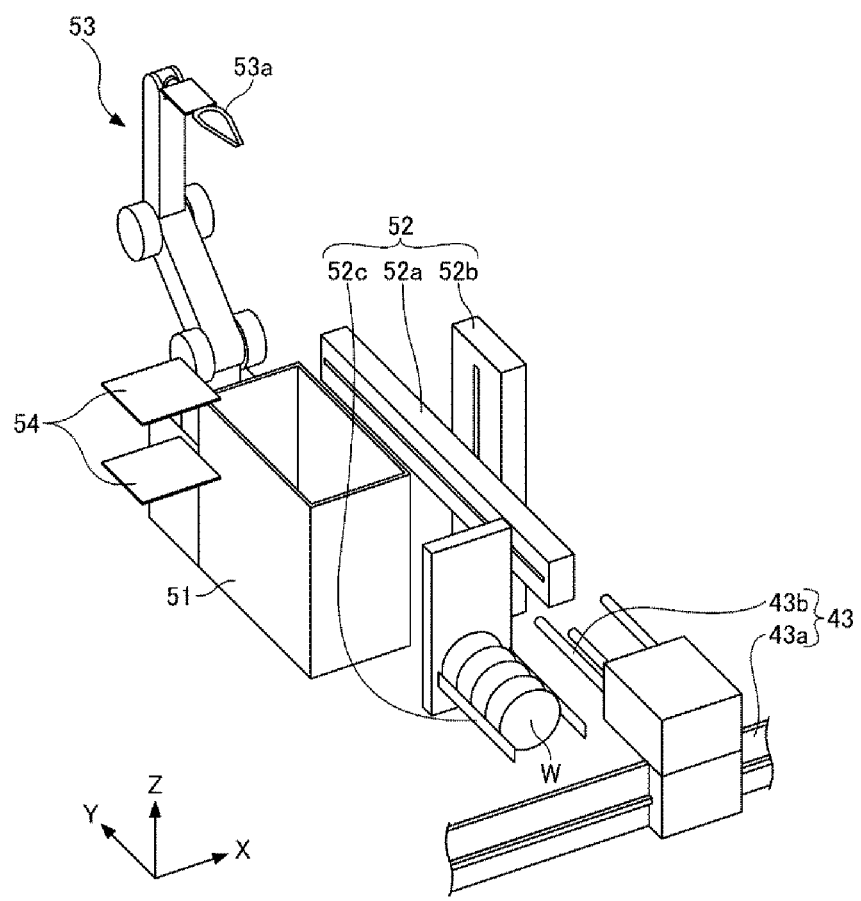
FIG. 9 is a schematic perspective view illustrating a second interface section of Modification 2.

As illustrated in FIG. 9, the Y-axis driving device 52a is attached to the negative side of the Z-axis driving device 52b in the X-axis direction. The Y-axis driving device 52a is supported to be movable along the Z-axis direction by the Z-axis driving device 52b. The second transfer arm 52c is supported to be movable along the Y-axis direction by the Y-axis driving device 52a.

A second interface section 5C according to Modification 3 will be described with reference to FIG. 10. The second interface section 5C is different from the second interface section 5B in that the two Z-axis driving devices 52b are provided, and the Y-axis driving device 52a is supported to be movable along the Z-axis direction by the two Z-axis driving devices 52b. Other configurations of the second interface section 5C may be the same as those of the second interface section 5B.

Figure 10:
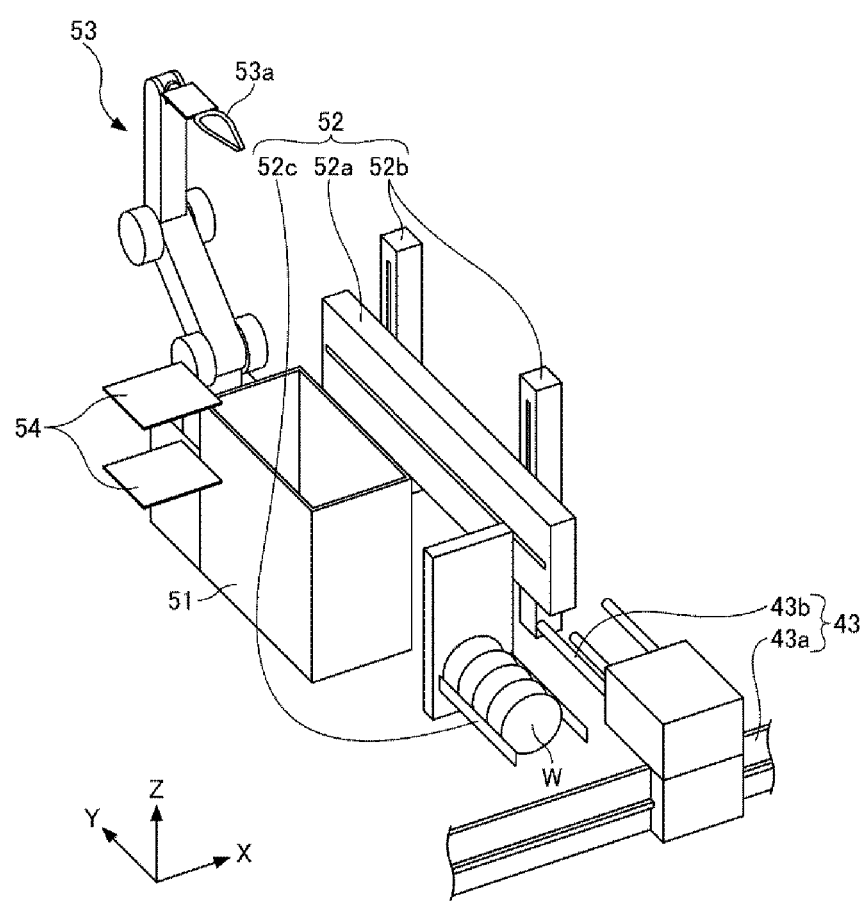
FIG. 10 is a schematic perspective view illustrating a second interface section of Modification 3.

As illustrated in FIG. 10, the two Z-axis driving devices 52b are provided parallel to each other with a space in the Y-axis direction. The Y-axis driving device 52a is supported to be movable along the Z-axis direction by the two Z-axis driving devices 52b.

A second interface section 5D according to Modification 4 will be described with reference to FIG. 11. The second interface section 5D is different from the second interface section 5 in that the Y-axis driving device 52a is provided on the lower side of the Z-axis driving device 52b. Other configurations of the second interface section 5D may be the same as those of the second interface section 5.

Figure 11:
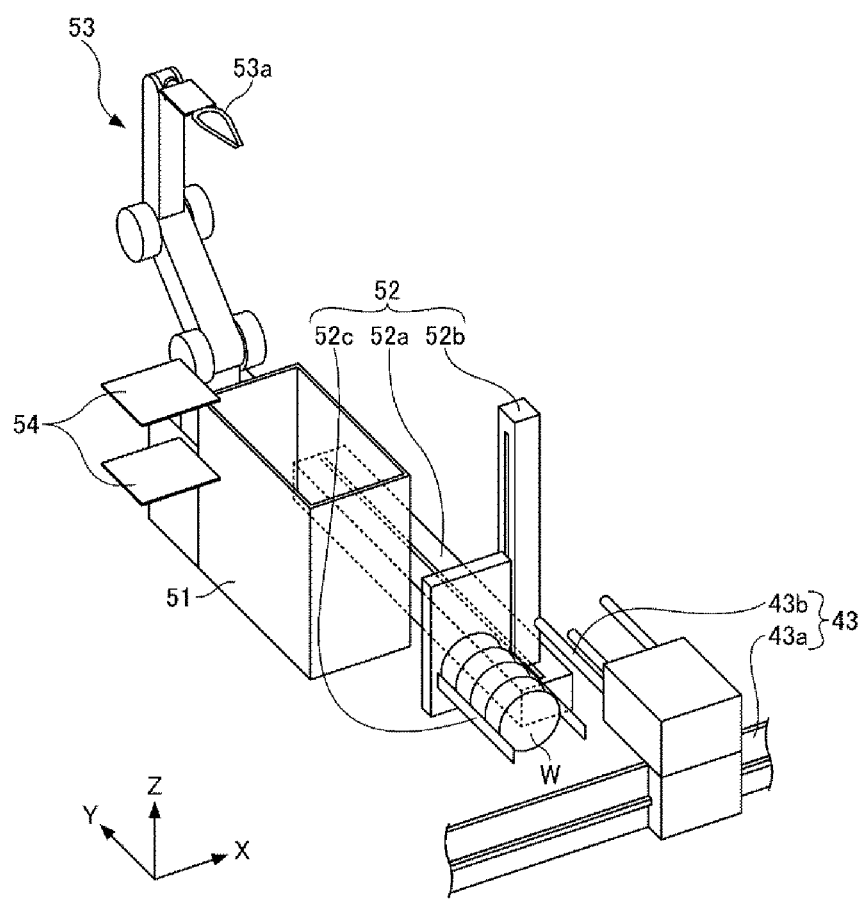
FIG. 11 is a schematic perspective view illustrating a second interface section of Modification 4.

As illustrated in FIG. 11, the Y-axis driving device 52a extends from the second interface section 5D to the batch processing section 4 along the Y-axis direction on the lower side of the Z-axis driving device 52b. The Z-axis driving device 52b is attached to the positive side of the Y-axis driving device 52a in the Z-axis direction. The Z-axis driving device 52b is supported to be movable along the Y-axis direction by the Y-axis driving device 52a.

A second interface section 5E according to Modification 5 will be described with reference to FIG. 12. The second interface section 5E is different from the second interface section 5 in that the Y-axis driving device 52a is provided on the upper side of the Z-axis driving device 52b. Other configurations of the second interface section 5E may be the same as those of the second interface section 5.

Figure 12:
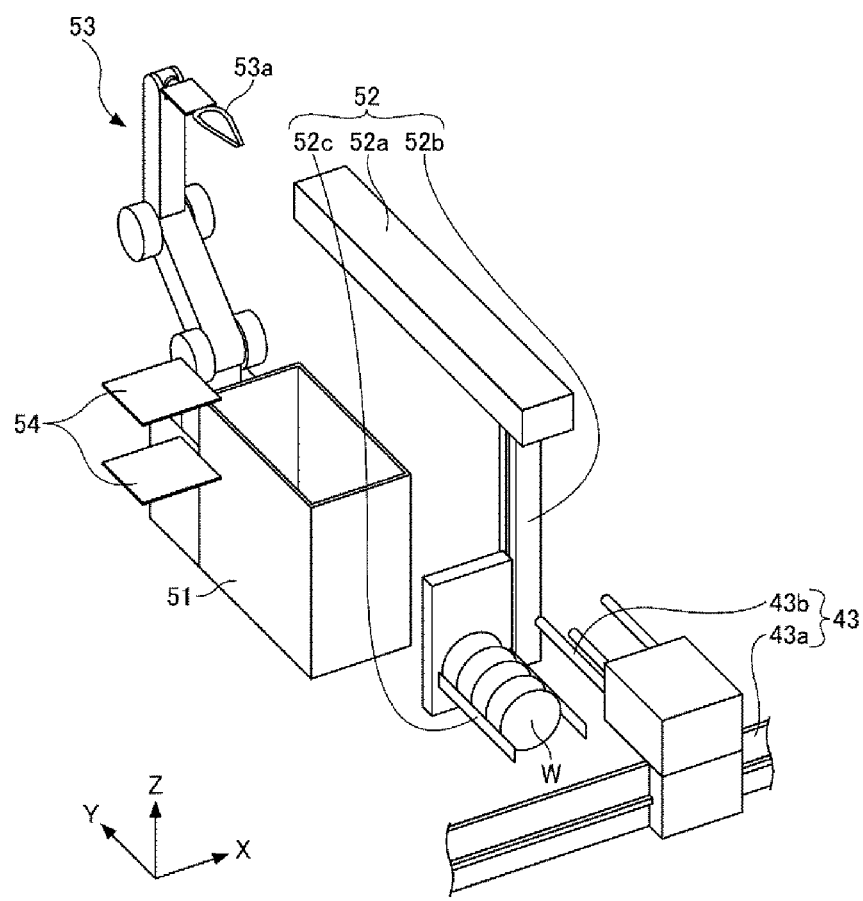
FIG. 12 is a schematic perspective view illustrating a second interface section of Modification 2.

As illustrated in FIG. 12, the Y-axis driving device 52a extends from the second interface section 5 to the batch processing section 4 along the Y-axis direction on the upper side of the Z-axis driving device 52b. The Z-axis driving device 52b is attached to the negative side of the Y-axis driving device 52a in the Z-axis direction. The Z-axis driving device 52b is supported to be movable along the Y-axis direction by the Y-axis driving device 52a.

A second interface section 5F according to Modification 6 will be described with reference to FIG. 13. The second interface section 5F is different from the second interface section 5 in that a multi-axis (e.g., six-axis) robot arm 52d is provided instead of the Y-axis driving device 52a and the Z-axis driving device 52b. Other configurations of the second interface section 5F may be the same as those of the second interface section 5.

Figure 13:
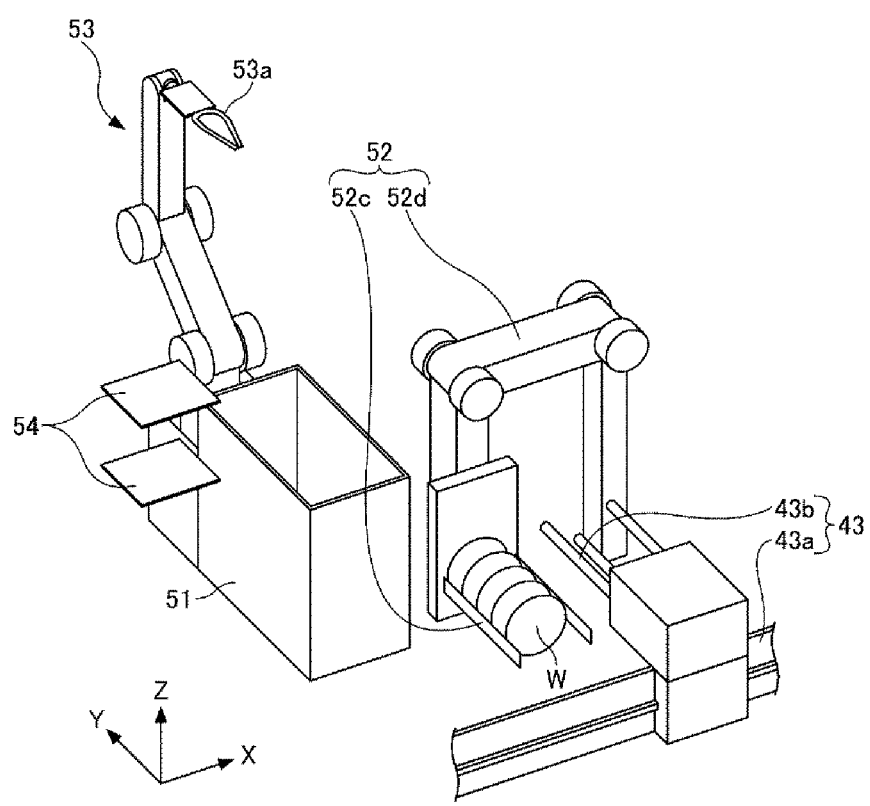
FIG. 13 is a schematic perspective view illustrating a second interface section of Modification 6.

As illustrated in FIG. 13, the second transfer device 52 includes the multi-axis robot arm 52d and the second transfer arm 52c. The multi-axis robot arm 52d may be, for example, a six-axis robot arm. The second transfer arm 52c is attached to a tip of the multi-axis robot arm 52d. The second transfer arm 52c may take any position and posture in the three-dimensional space while holding a plurality of substrates W by the multi-axis robot arm 52d.

In the above embodiment, the drying device 63 dries the substrate W with the supercritical fluid, but the drying method is not particularly limited. The drying method may be any method as long as the method can suppress the collapse of the uneven pattern of the substrate W, and may be, for example, spin drying, scan drying, or water-repellent drying. In the spin drying, the substrate W is rotated to shake off the liquid film from the substrate W by centrifugal force. In scan drying, the substrate W is rotated to shake off the liquid film from the substrate W by centrifugal force while moving the supply position of the drying liquid from the center of the substrate W toward the outer periphery of the substrate W. In the scan drying, the supply position of the drying gas such as $N_2$ gas may also be moved from the center of the substrate W toward the outer periphery of the substrate W so as to follow the supply position of the drying liquid.

Figure 14:
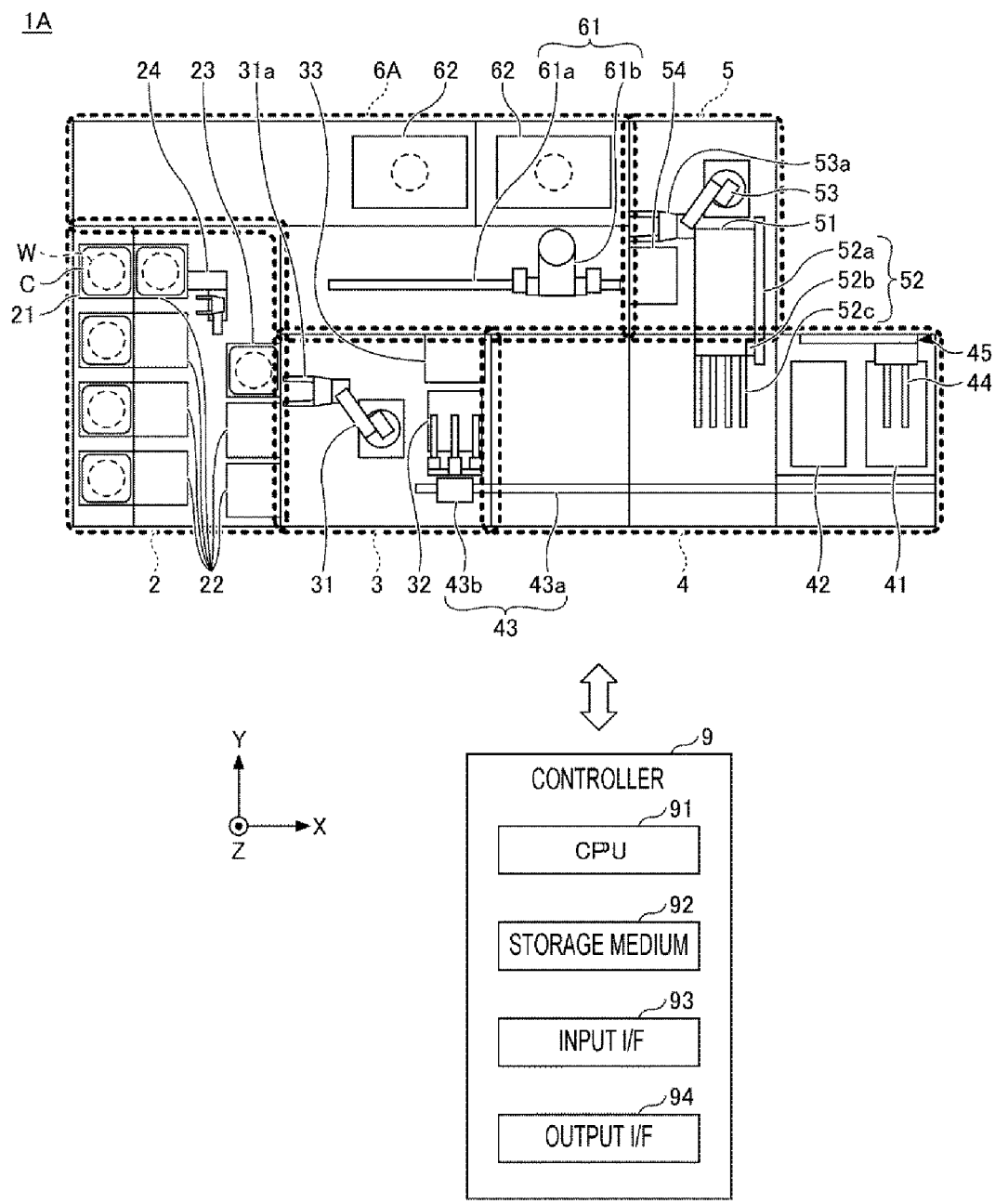
FIG. 14 is a schematic plan view illustrating a substrate processing system according to Modification of an embodiment.

FIG. 14 is a schematic plan view illustrating a substrate processing system 1A according to Modification of the embodiment. The substrate processing system 1A illustrated in FIG. 14 may be adopted when the drying method is the spin drying, the scan drying, or the water-repellent drying.

As illustrated in FIG. 14, in the substrate processing system 1A, the liquid processing device 62 is disposed instead of the drying device 63. That is, the substrate processing system 1A includes a single-wafer processing section 6A having the fourth transfer device 61 and the liquid processing device 62.

The liquid processing device 62 is a single-wafer type, and processes the substrate W with the processing liquid one by one. The liquid processing device 62 is configured to be capable of performing at least one of the spin drying, the scan drying, and the water-repellent drying. The liquid processing device 62 is disposed in a plurality of rows (e.g., two rows) in the horizontal direction (X-axis direction), and in multiple tiers (e.g., three tiers) in the vertical direction (Z-axis direction). As a result, a plurality of substrates W may be processed with the processing liquid at the same time.

According to the present disclosure, the productivity of the substrate processing system may be improved.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system comprising:
    a carry-in/out section in which a cassette accommodating a plurality of substrates is carried in/out;
    a batch processing section in which a wafer lot including the plurality of substrates is collectively processed;
    a single-wafer processing section in which the plurality of substrates included in the wafer lot are processed one by one; and
    an interface section that delivers the plurality of substrates between the batch processing section and the single-wafer processing section,
    wherein the batch processing section includes:
        a processing bath in which the wafer lot is immersed and processed; and
        a first transfer device including a first transfer arm configured to transfer the wafer lot to the processing bath, and
    wherein the interface section includes:
        an immersion bath disposed outside a movement range of the first transfer device and configured to immerse the wafer lot; and
        a second transfer device including a second transfer arm configured to hold and transfer the wafer lot between the first transfer device and the immersion bath.

2. The substrate processing system according to claim 1, wherein the first transfer device is movable in a first horizontal direction, and the immersion bath is disposed at a position deviated from the processing bath in a second horizontal direction orthogonal to the first horizontal direction.

3. The substrate processing system according to claim 2, wherein the second transfer device includes a driver that moves the second transfer arm in the second horizontal direction and a vertical direction.

4. The substrate processing system according to claim 3, wherein the driver includes:
    a vertical driver that supports the second transfer arm to be movable along the vertical direction; and
    a horizontal driver that supports the vertical driver to be movable along the second horizontal direction.

5. The substrate processing system according to claim 3, wherein the driver includes:
    a horizontal driver that supports the second transfer arm to be movable along the second horizontal direction; and
    a vertical driver that supports the horizontal driver to be movable along the vertical direction.

6. The substrate processing system according to claim 3, wherein the driver is constituted by a multi-axis robot arm.

7. The substrate processing system according to claim 3, wherein the second transfer arm is movable to a plurality of positions including a delivery position where the wafer lot is received from the first transfer device, an immersion position where the wafer lot is immersed in the immersion bath, and a standby position immediately below the delivery position, and
    the driver moves the second transfer arm to the immersion position or the standby position while the first transfer device is being operated.

8. The substrate processing system according to claim 2, wherein the interface section is disposed adjacent to the batch processing section in the second horizontal direction, and adjacent to the single-wafer processing section in the first horizontal direction.

9. The substrate processing system according to claim 2, wherein the single-wafer processing section includes:
    a liquid processor that processes the plurality of substrates one by one with a liquid; and
    a drier that dries the plurality of substrates one by one with a supercritical fluid, and
    wherein the drier is disposed adjacent to the liquid processing device in the first horizontal direction.

10. The substrate processing system according to claim 1, wherein the interface section includes:
    a delivery table disposed adjacent to the single-wafer processing section and configured to deliver the plurality of substrates to and from the single-wafer processing section; and
    a third transfer device including a third transfer arm configured to receive the plurality of substrates of the wafer lot that are immersed in the immersion bath and transfer the plurality of substrates to the transfer table.

11. The substrate processing system according to claim 1, wherein the immersion bath stores pure water in which the wafer lot is immersed.

12. A substrate processing method comprising:
    transferring a plurality of substrates in a wafer lot from a batch processing section in which the plurality of substrates in the wafer lot are collectively processed, to a single-wafer processing section in which the plurality of substrates in the wafer lot are processed one by one,
    wherein the transferring includes:

transferring the wafer lot to a processing bath in which the wafer lot is immersed and processed, by a first transfer device; and receiving the wafer lot from the first transfer device and transferring the wafer lot to an immersion bath in which the wafer lot is immersed, by a second transfer device, and wherein the immersion bath is disposed outside a movement range of the first transfer device.

* * * * *